US 8,830,673 B2

(12) United States Patent
Kuo

(10) Patent No.: US 8,830,673 B2
(45) Date of Patent: Sep. 9, 2014

(54) SERVER

(75) Inventor: Ho-Wen Kuo, Taipei (TW)

(73) Assignee: Inventec Corporation, Taipei (TW)

( * ) Notice: Subject to any disclaimer, the term of this patent is extended or adjusted under 35 U.S.C. 154(b) by 294 days.

(21) Appl. No.: 13/436,500

(22) Filed: Mar. 30, 2012

(65) Prior Publication Data

US 2013/0155609 A1 Jun. 20, 2013

(30) Foreign Application Priority Data

Dec. 20, 2011 (TW) .............................. 100147423 A

(51) Int. Cl.
*H05K 7/20* (2006.01)
(52) U.S. Cl.
USPC ............ 361/679.48; 361/679.49; 361/679.46; 361/679.58; 417/360; 454/184; 312/236
(58) Field of Classification Search
CPC . H05K 7/20; H05K 7/20563; H05K 7/20172; H05K 7/1489; G06F 1/20; G06F 1/183
USPC ........ 361/679.46–679.54, 688–723; 417/360; 454/184; 312/236
See application file for complete search history.

(56) References Cited

U.S. PATENT DOCUMENTS

| | | | |
|---|---|---|---|
| 7,438,571 B1* | 10/2008 | Barina et al. .................. | 439/157 |
| 2005/0002777 A1* | 1/2005 | Chuang ......................... | 415/127 |
| 2005/0105269 A1* | 5/2005 | Chen et al. .................... | 361/695 |
| 2008/0101033 A1* | 5/2008 | Cromwell et al. ............ | 361/719 |
| 2008/0128570 A1* | 6/2008 | Chen ........................ | 248/220.21 |

* cited by examiner

*Primary Examiner* — David M Sinclair
*Assistant Examiner* — Robert Brown
(74) *Attorney, Agent, or Firm* — CKC & Partners Co., Ltd.

(57) ABSTRACT

A server including a chassis, an electronic module, a fan module and a handle is provided. The chassis has a first wedging portion. The electronic module is disposed in the chassis. The fan module is disposed in the chassis and is adjacent to the electronic module. The handle is pivotally connected to the fan module and has a second wedging portion, and the first wedging portion is used for wedging the second wedging portion. When the handle is rotated, the fan module is moved relatively to the first wedging portion for entering or exiting the chassis.

7 Claims, 4 Drawing Sheets

SERVER

CROSS-REFERENCE TO RELATED APPLICATION

This application claims the priority benefit of Taiwan application serial no. 100147423, filed Dec. 20, 2011. The entirety of the above-mentioned patent application is hereby incorporated by reference herein and made a part of this specification.

BACKGROUND OF THE INVENTION

1. Field of the Invention

The present invention generally relates to a server, in particular, to a server having a fan module.

2. Description of Related Art

With the development of computers and networks, generally enterprises or organizations all need to be equipped with servers, and large-scale network service providers have even greater demands. Due to the improvement of the computing capability of the server, the generated waste heat is increased accordingly. Therefore, a fan module is disposed in the server to dissipate the heat generated by the server after a long time operation, which prevents breakdown of the system or even damage to the electronic components caused by overheat.

Generally speaking, the fan module is locked in the chassis through several screws, and is disposed close to the electronic module (for example, a mainboard module or a hard disk module) to achieve the optimal heat dissipation effect. When the fan module needs to be replaced or maintained, the chassis usually needs to be drawn out completely, and the screws for locking the fan module are removed with a tool for subsequent maintenance or replacement. However, in the limited space of the chassis, if the screw drops unexpectedly, it is inconvenient for the maintainer to operate.

SUMMARY OF THE INVENTION

The present invention provides a server, having a fan module that can be conveniently assembled in a chassis.

The present invention provides a server, including a chassis, an electronic module, a fan module and a handle. The chassis has a first wedging portion. The electronic module is disposed in the chassis. The fan module is disposed in the chassis and is adjacent to the electronic module. The handle is pivotally connected to the fan module and has a second wedging portion, and the first wedging portion is used for wedging the second wedging portion. When the handle is rotated, the fan module is moved relatively to the first wedging portion for entering or exiting the chassis.

In an embodiment of the present invention, the handle has a main body portion and two pivotal connection portions, the two pivotal connection portions extend from two ends of the main body portion and bend, and the second wedging portion is located at one of the two pivotal connection portions.

In an embodiment of the present invention, the first wedging portion is one of a groove and a pillar, and the second wedging portion is the other of the groove and the pillar.

In an embodiment of the present invention, the server further includes a connection circuit board, having an electronic module connection port and at least one input/output connection port. The electronic module connection port is connected to the electronic module, and the input/output connection port is adjacent to the handle.

In an embodiment of the present invention, the connection circuit board has a first circuit board body, a second circuit board body, and a connection board body. The first circuit board body and the second circuit board body are assembled to the fan module, and the connection board body is connected to the first circuit board body and the second circuit board body. The electronic module connection port is disposed on the first circuit board body, and the input/output connection port is disposed on the second circuit board body.

In an embodiment of the present invention, the server further includes a carrier board, assembled to the fan module and having two positioning pillars. The connection circuit board is disposed on the carrier board, and the electronic module connection port is located between the positioning pillars. When the electronic module connection port is connected to the electronic module, the positioning pillars are inserted in two ends of the electronic module.

In an embodiment of the present invention, the fan module includes a casing, a first fan and a plurality of flexible members, and the first fan is suspended in the casing via the flexible members.

In an embodiment of the present invention, the fan module further includes a second fan and an absorbing vibration foam. The second fan is adjacent to the first fan and is suspended in the casing via the flexible members, and the absorbing vibration foam is disposed between the first fan and the second fan.

In an embodiment of the present invention, each flexible member has a fixing portion, a spacing portion, and a protruding portion. The fixing portion is buckled to the casing, and the spacing portion is located between the fixing portion and the protruding portion. The spacing portion separates the casing from the first fan or separates the casing from the second fan, and the protruding portion is inserted in an opening of the first fan or the second fan.

In view of the above, according to the present invention, the chassis has the first wedging portion, and the handle has the second wedging portion. When the handle is rotated, the first wedging portion cooperates with the second wedging portion, and the fan module is moved relatively to the first wedging portion for entering or exiting the chassis. Thereby, the user may disassemble or assemble the fan module without using screws or any locking tool, so as to prevent disadvantages caused by fixing the fan module with screws.

In order to make the aforementioned features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
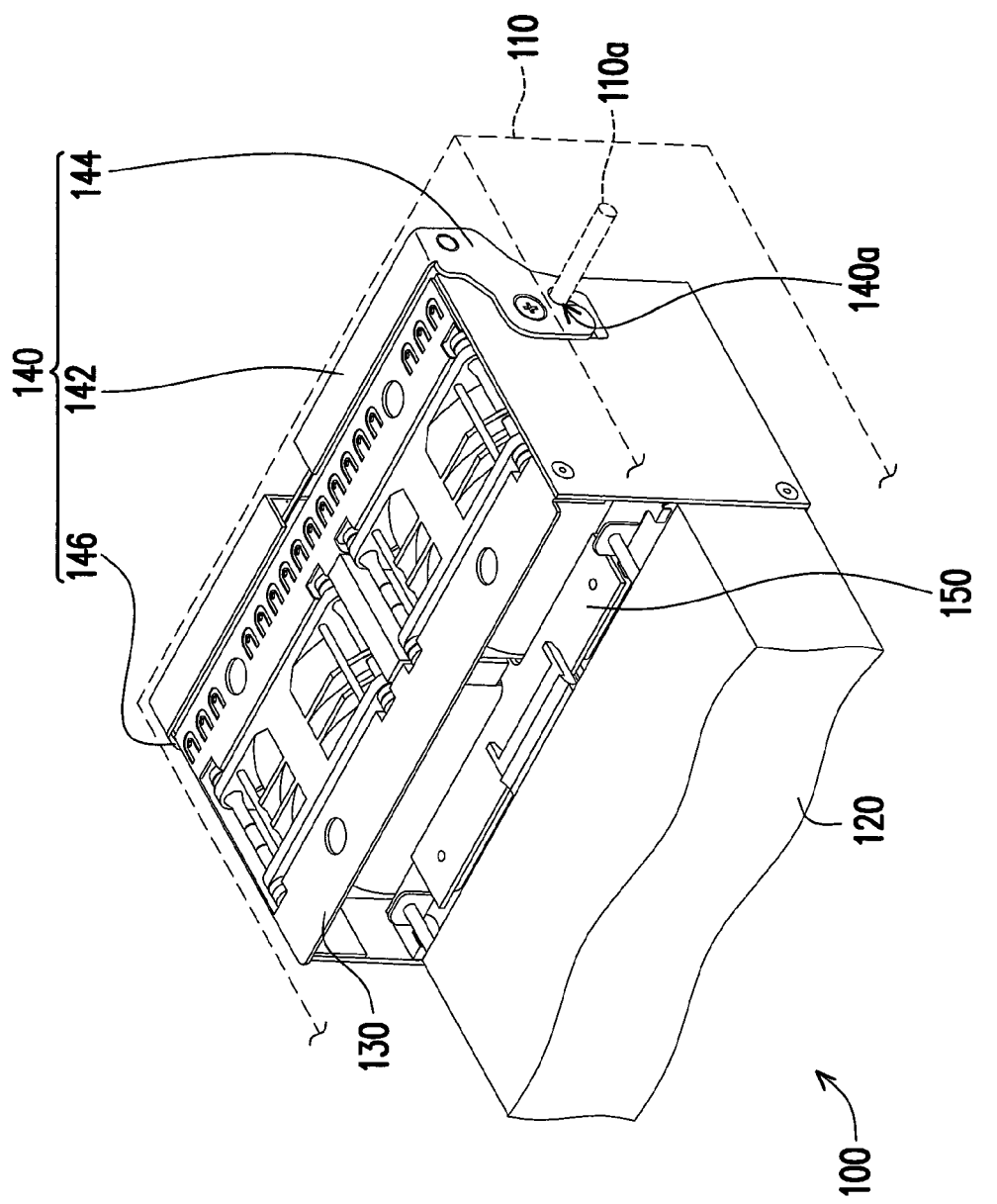
FIG. 1 is a three-dimensional view of a server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
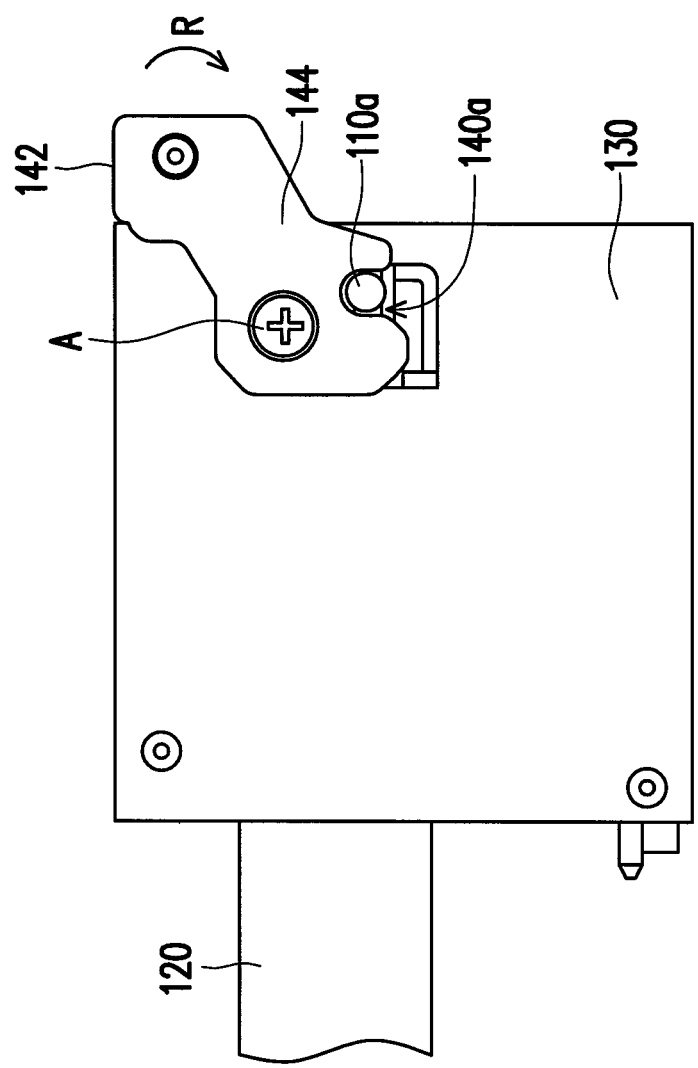
FIG. 2 is a side view of the server in FIG. 1.

FIG. 1 is a three-dimensional view of a server according to an embodiment of the present invention. FIG. 2 is a side view of the server in FIG. 1. Referring to FIG. 1 and FIG. 2, in this embodiment, the server 100 is, for example, one of multiple servers disposed in a cabinet (not shown). The server 100 includes a chassis 110, an electronic module 120, a fan module 130 and a handle 140. It should be noted that, to make the drawings concise and understandable, the chassis 110 in FIG. 1 is marked by dashed lines, and the electronic module 120 and the chassis 110 are only partially depicted.

In view of the above, the chassis 110 has a first wedging portion 110a, and the electronic module 120 is disposed in the chassis 110. The fan module 130 is disposed in the chassis 110 and is adjacent to the electronic module 120. The handle 140 is pivotally connected to the fan module 130, and a pivot A is located between the handle 140 and the fan module 130. Moreover, the handle 140 has a second wedging portion 140a, and the first wedging portion 110a is used for wedging the second wedging portion 140a. When the handle 140 is rotated, the fan module 130 is moved relatively to the first wedging portion 110a for entering or exiting the chassis 110.

Specifically, when the user intends to remove the fan module 130, the handle 140 is rotated along the pivot A towards a rotation direction R (for example, a clockwise direction), and the second wedging portion 140a and the first wedging portion 110a generate partial structure interference to drive the fan module 130 to move relative to the first wedging portion 110a. After the wedging relation between the first wedging portion 110a and the second wedging portion 140a in the horizontal direction in FIG. 2 is released, the user may draw the fan module 130 out of the chassis 110 by using the handle 140.

On the contrary, when the fan module 130 is disposed in the chassis 110 and the first wedging portion 110a cooperates with the second wedging portion 140, the handle 140 is rotated along the pivot A in a direction opposite to the rotation direction R (for example, a counterclockwise direction), and the first wedging portion 110a wedges the second wedging portion 140a to drive the fan module 130 to move leftward in FIG. 2, so as to be assembled in the chassis 110. Thereby, the user may disassemble or assemble the fan module 130 conveniently. In addition, the user does not need to use screws or any locking tool, so as to prevent disadvantages caused by fixing the fan module 130 with screws.

Further, the handle 140 of this embodiment has a main body portion 142 and two pivotal connection portions 144, 146, the pivotal connection portions 144, 146 extend from two ends of the main body portion 142 and bend, and the second wedging portion 140a is located at one of the pivotal connection portions 144, 146. Moreover, the first wedging portion 110a of the chassis 110 in this embodiment may be a pillar, and the second wedging portion 140a of the handle 140 may be a groove. On the contrary, when the first wedging portion 110a of the chassis 110 is a groove, the second wedging portion 140a of the handle 140 is a pillar.

Figure 3:
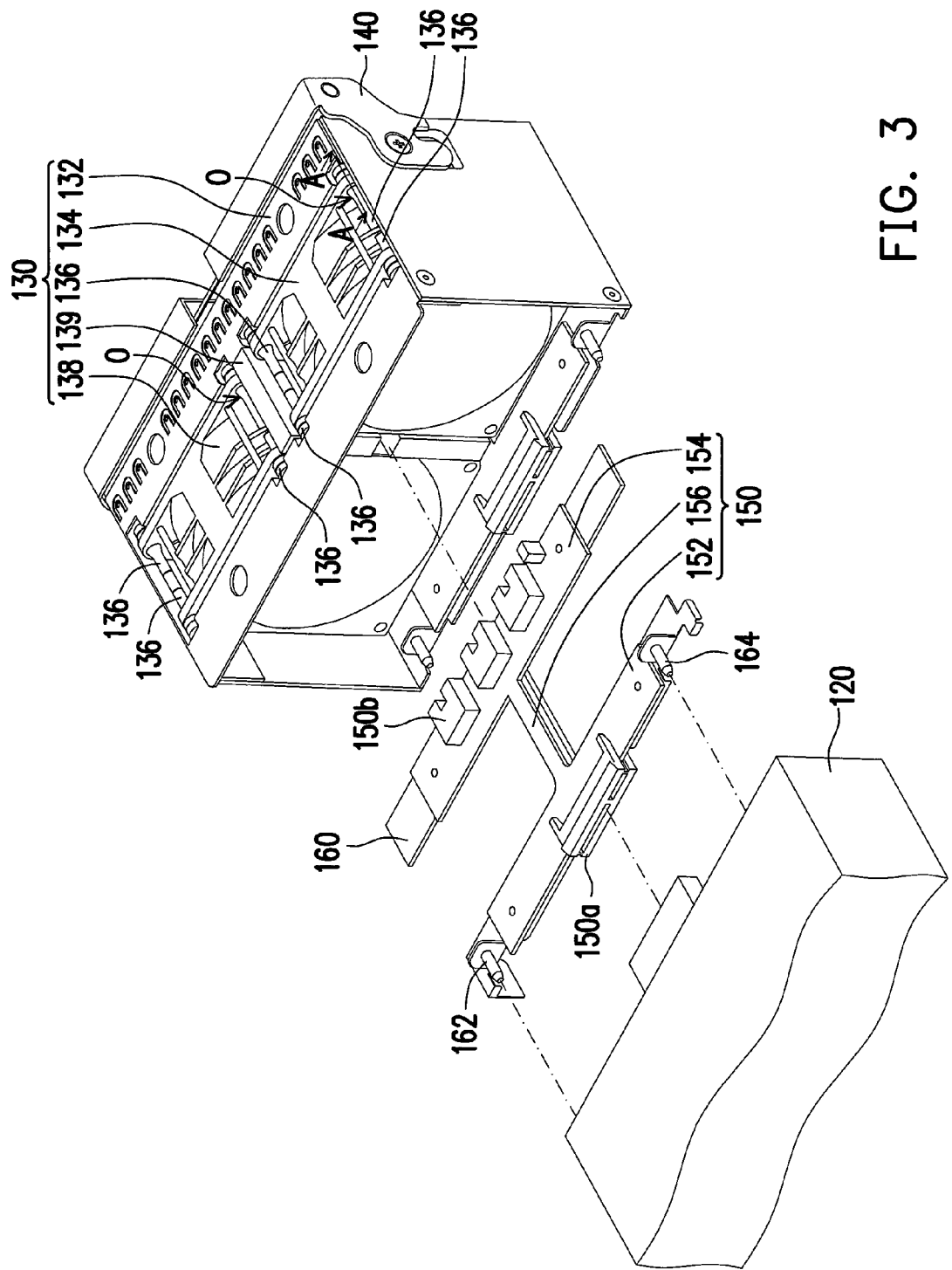
FIG. 3 is an exploded view of the server in FIG. 1.

FIG. 3 is an exploded view of the server in FIG. 1. Referring to FIG. 1 and FIG. 3, the server 100 further includes a connection circuit board 150, having an electronic module connection port 150a and at least one input/output connection port 150b. The electronic module connection port 150a is connected to the electronic module 120, and the input/output connection port 150b is adjacent to the handle 140. The connection circuit board 150 has a first circuit board body 152, a second circuit board body 154 and a connection board body 156. The first circuit board body 152 and the second circuit board body 154 are assembled to the fan module 130, and the connection board body 156 is connected to the first circuit board body 152 and the second circuit board body 154. The electronic module connection port 150a is disposed on the first circuit board body 152, and the input/output connection port 150b is disposed on the second circuit board body 154.

In view of the above, when the electronic module connection port 150a is connected to the electronic module 120 (for example, a mainboard module), the user may electrically connect the input/output connection port 150b and the electronic module 120. In addition, the electronic module connection port 150a is designed in the fan module 130. When assembling the fan module 130, the user may connect the electronic module connection port 150a to the electronic module 120 at the same time, which is rather convenient.

Moreover, the server 100 further includes a carrier board 160 assembled to the fan module 130. The carrier board 160 has two positioning pillars 162, 164, and the electronic module connection port 150a is located between the two positioning pillars 162, 164. When the electronic module connection port 150a is connected to the electronic module 120, the positioning pillars 162, 164 are inserted in two ends of the electronic module 120. Thereby, when the user intends to assemble the fan module 130 to the chassis 110 (as shown in FIG. 1), the positioning pillars 162, 164 are inserted in two sides of the electronic module 120, for positioning the fan module 130.

Referring to FIG. 3, the fan module 130 of this embodiment includes a casing 132, a first fan 134 and a plurality of flexible members 136. The first fan 134 is suspended in the casing 132 via the flexible members 136. Through this configuration, when the first fan 134 operates, the flexible members 136 may absorb the vibration of the first fan 134, to prevent the vibration of the first fan 134 from being transferred to the casing 132, and prevent the vibration of the first fan 134 from affecting other electronic components or even causing damage to the other electronic components. In addition, the material of the flexible members 136 in this embodiment may be a absorbing vibration material, for example, rubber.

In view of the above, the fan module 130 further includes a second fan 138 and a absorbing vibration foam 139. The second fan 138 is adjacent to the first fan 134 and is suspended in the casing 132 via the flexible members 136, and the absorbing vibration foam 139 is disposed between the first fan 134 and the second fan 138. Through this configuration, the vibration of the first fan 134 and the vibration of the second fan 138 are further prevented from being transferred to the casing 132.

Figure 4:
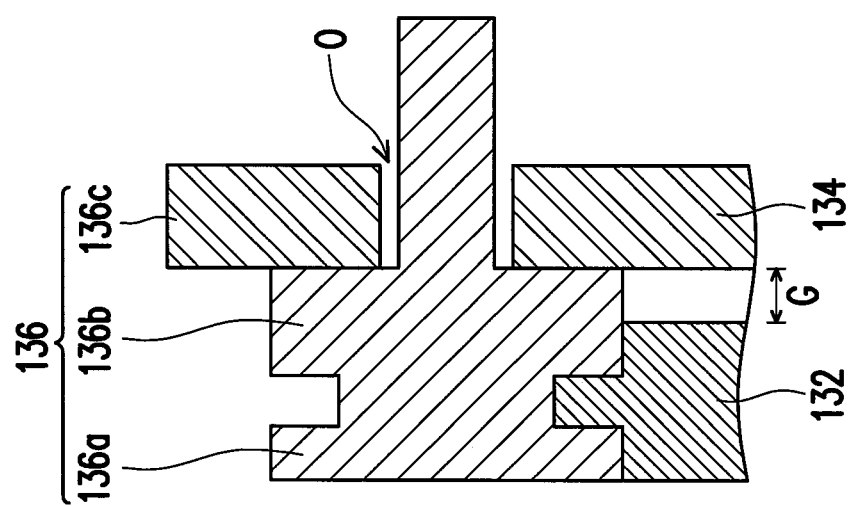
FIG. 4 is a partial cross-sectional view of a fan module in FIG. 3 along Section line A-A.

FIG. 4 is a partial cross-sectional view of the fan module in FIG. 3 along Section line A-A. Referring to FIG. 3 and FIG. 4, each flexible member 136 of this embodiment has a fixing portion 136a, a spacing portion 136b and a protruding portion 136c. The fixing portion 136a is buckled to the casing 132, and the spacing portion 136b is located between the fixing portion 136a and the protruding portion 136c. The spacing portion 136b separates the casing 132 from the first fan 134 or separates the casing 132 from the second fan 138, and the protruding portion 136c is inserted in an opening O of the first fan 134 or the second fan 138. Thereby, the spacing portion rests on the fan (the first fan 134 or the second fan 138) and the casing 132, so that a gap G is provided therebetween, to isolate the vibration of the first fan 134 or the second fan 138. In addition, the protruding portion 136c is inserted in the opening O of the first fan 134 or the second fan 138, to suspend the first fan 134 or the second fan 138.

In view of the above, according to the present invention, the chassis has the first wedging portion, and the handle has the second wedging portion. When the user rotates the handle, the first wedging portion cooperates with the second wedging portion, and the fan module is moved relatively to the first wedging portion for entering or exiting the chassis. Thereby, the user may fix the fan module without using screws or any locking tool, so as to prevent disadvantages caused by fixing the fan module with screws. In addition, when the fan module has a flexible member or absorbing vibration foam, the absorption of the vibration of the fan is enhanced, to prevent the vibration of the fan from affecting other electronic components.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server, comprising:
   a chassis, having a first wedging portion;
   an electronic module, disposed in the chassis;
   a fan module, disposed in the chassis and adjacent to the electronic module;
   a handle, pivotally connected to the fan module and having a second wedging portion, wherein the first wedging portion is used for wedging the second wedging portion, and when the handle is rotated, the fan module is moved relatively to the first wedging portion for entering or exiting the chassis; and
   a connection circuit board, having an electronic module connection port and at least one input/output connection port, wherein the electronic module connection port is connected to the electronic module, and the input/output connection port is adjacent to the handle.

2. The server according to claim 1, wherein the handle has a main body portion and two pivotal connection portions, the pivotal connection portions extend from two ends of the main body portion and bend, and the second wedging portion is located at one of the pivotal connection portions.

3. The server according to claim 1, wherein the first wedging portion is one of a groove and a pillar, and the second wedging portion is the other of the groove and the pillar.

4. The server according to claim 1, wherein the connection circuit board has a first circuit board body, a second circuit board body, and a connection board body, the first circuit board body and the second circuit board body are assembled to the fan module, the connection board body is connected to the first circuit board body and the second circuit board body, the electronic module connection port is disposed on the first circuit board body, and the input/output connection port is disposed on the second circuit board body.

5. The server according to claim 1, further comprising a carrier board, assembled to the fan module and having two positioning pillars, wherein the connection circuit board is disposed on the carrier board, the electronic module connection port is located between the positioning pillars, and when the electronic module connection port is connected to the electronic module, the positioning pillars are inserted in two ends of the electronic module.

6. The server according to claim 1, wherein the fan module comprises:
   a casing:
   a first fan; and
   multiple flexible members, wherein the first fan is suspended in the casing via the flexible members.

7. The server according to claim 6, wherein the fan module further comprises:
   a second fan, adjacent to the first fan and suspended in the casing via the flexible members, wherein each flexible member has a fixing portion, a spacing portion, and a protruding portion, the fixing portion is buckled to the casing, the spacing portion is located between the fixing portion and the protruding portion, the spacing portion separates the casing from the first fan or separates the casing from the second fan, and the protruding portion is inserted in an opening of the first fan or the second fan; and
   an absorbing vibration foam, disposed between the first fan and the second fan.

* * * * *